US012603654B2

(12) United States Patent
Mendoza

(10) Patent No.: US 12,603,654 B2
(45) Date of Patent: Apr. 14, 2026

(54) PHASE LOCK LOOP FILTER WITH COMMON MODE NOISE REJECTION

(71) Applicant: BAE Systems Information and Electronic Systems Integration Inc., Nashua, NH (US)

(72) Inventor: Norman J. Mendoza, Hudson, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 173 days.

(21) Appl. No.: 18/432,483

(22) Filed: Feb. 5, 2024

(65) Prior Publication Data

US 2025/0253857 A1 Aug. 7, 2025

(51) Int. Cl.
| | |
|---|---|
| *H03D 3/24* | (2006.01) |
| *H03L 7/089* | (2006.01) |
| *H03L 7/099* | (2006.01) |

(52) U.S. Cl.
CPC .......... *H03L 7/0991* (2013.01); *H03L 7/0891* (2013.01)

(58) Field of Classification Search
CPC ...... H03L 7/0991; H03L 7/0891; H03L 7/093
USPC .................................. 375/376, 373–375, 350
See application file for complete search history.

(56) References Cited

U.S. PATENT DOCUMENTS

| | | | |
|---|---|---|---|
| 6,262,633 B1 | 7/2001 | Close |
| 6,856,204 B2 | 2/2005 | Kwon |
| 7,023,249 B1 | 4/2006 | Mulbrook |
| 7,203,149 B1 | 4/2007 | Sano |
| 7,312,663 B2 | 12/2007 | Abel |
| 7,719,365 B2 | 5/2010 | Sahu et al. |
| 7,786,771 B2 | 8/2010 | Tsai et al. |
| 8,179,174 B2 | 5/2012 | Bunch |
| 8,432,201 B1 | 4/2013 | Sinha et al. |
| 8,638,143 B2 | 1/2014 | Nilsson et al. |
| 8,760,203 B1 | 6/2014 | Amourah |
| 8,773,184 B1 | 7/2014 | Petrov et al. |
| 8,791,736 B2 | 7/2014 | Dang |
| 8,854,094 B2 | 10/2014 | Shin |
| 9,048,849 B2 | 6/2015 | Choi et al. |
| 9,438,254 B1 | 9/2016 | Lahiri |

(Continued)

FOREIGN PATENT DOCUMENTS

| | | |
|---|---|---|
| EP | 2326011 B1 | 6/2012 |
| WO | 2022199852 A1 | 9/2022 |

OTHER PUBLICATIONS

"High Performance, 145 MHz FastFET Op Amps, AD8065/ AD8066," Analog Devices—Data Sheet, 2002-2019. 28 pages.

(Continued)

*Primary Examiner* — Phuong Phu
(74) *Attorney, Agent, or Firm* — Gary McFaline

(57) ABSTRACT

A circuit includes (i) an input terminal for receiving a single-ended input signal; (ii) an operational amplifier (op-amp) comprising an inverting input, a non-inverting input, and an op-amp output; (iii) a capacitor coupled between the inverting input and the op-amp output; (iv) a first resistor coupled between the inverting input and the input terminal; and (v) a second resistor coupled between the non-inverting input and the input terminal. In an example, a phase locked loop (PLL) includes the circuit, and a voltage controlled oscillator (VCO) is coupled to the output of the operational amplifier.

13 Claims, 5 Drawing Sheets

(56) References Cited

U.S. PATENT DOCUMENTS

| | | | |
|---|---|---|---|
| 10,911,053 B2 | 2/2021 | Gupta et al. | |
| 2006/0071721 A1 | 4/2006 | Easwaran et al. | |
| 2010/0277245 A1* | 11/2010 | Liu | H03L 7/093 |
| | | | 331/34 |
| 2022/0224348 A1* | 7/2022 | Perrott | H03L 7/093 |
| 2023/0074921 A1 | 3/2023 | Sjoland et al. | |

OTHER PUBLICATIONS

"Common Mode Rejection Ratio (CMRR) and the Operational Amplifier," Electronics Projects Focus (Elprocus) 2013-2023. 6 pages.

"Signal Chain Basics #96: Active Loop Filter Designs," Planet Analog, Dec. 5, 2014. Retrieved from the internet at: https://www.planetanalog.com/, 7 pages.

"What is Common-Mode Rejection Ratio in Op-amps," What is Sound?, Jan. 11, 2021. 4 pages.

* cited by examiner

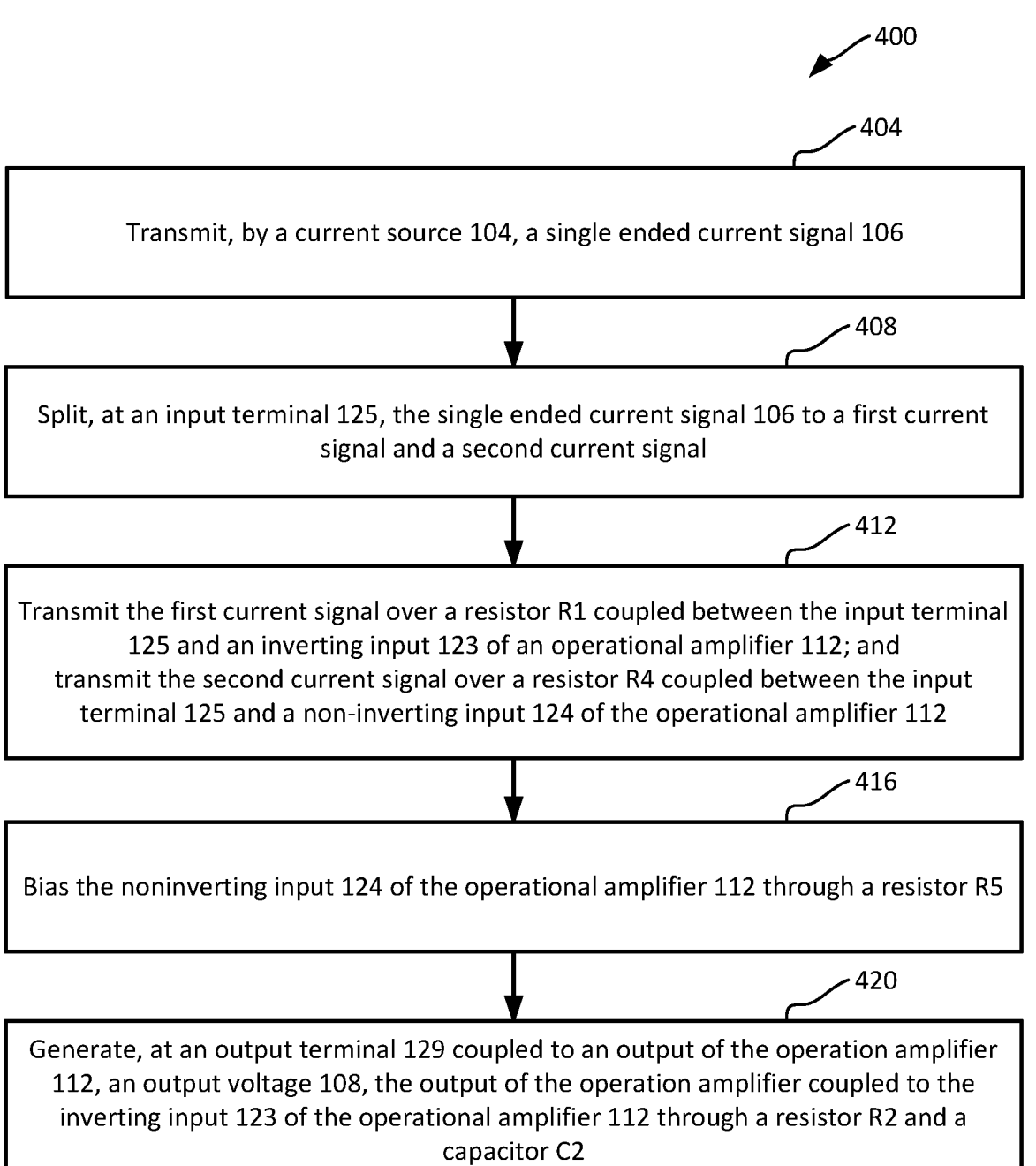

400

404

Transmit, by a current source 104, a single ended current signal 106

408

Split, at an input terminal 125, the single ended current signal 106 to a first current signal and a second current signal

412

Transmit the first current signal over a resistor R1 coupled between the input terminal 125 and an inverting input 123 of an operational amplifier 112; and
transmit the second current signal over a resistor R4 coupled between the input terminal 125 and a non-inverting input 124 of the operational amplifier 112

416

Bias the noninverting input 124 of the operational amplifier 112 through a resistor R5

420

Generate, at an output terminal 129 coupled to an output of the operation amplifier 112, an output voltage 108, the output of the operation amplifier coupled to the inverting input 123 of the operational amplifier 112 through a resistor R2 and a capacitor C2

FIG. 4

PHASE LOCK LOOP FILTER WITH COMMON MODE NOISE REJECTION

FIELD OF DISCLOSURE

The present disclosure relates to noise filtering in electronic circuits, and more particularly, to noise filtering in phase lock loop circuits.

BACKGROUND

Phase lock loops (PLL) are used widely in modern electronic devices. A PLL is a feedback control system that can adjust a phase of a periodic output signal generated by the PLL to match a phase of a periodic input or reference signal. A PLL generally includes a phase/frequency detector (PFD), a loop filter, and a voltage controlled oscillator (VCO). The VCO generates the periodic output signal at a specific frequency based on a voltage (error voltage) provided by the PFD. In more detail, the PFD compares the phase of the periodic output signal generated by the VCO with the phase of the periodic reference signal, to generate an error voltage which is used adjust the VCO, which in turn keeps the phase of the periodic output signal matched to the phase of the periodic reference signal. The loop filter attenuates unwanted high-frequency components from the PFD output. Some PLLs may include a separate charge pump effectively between the PFD and the loop filter, although the charge pump may also be integrated with the PFD or the loop filter or both.

BRIEF DESCRIPTION OF THE DRAWINGS

FIG. 4 illustrates a flowchart depicting a method of operating the example circuit of FIGS. 1A-2B, in accordance with an embodiment of the present disclosure.

Figures 1A, 1B:
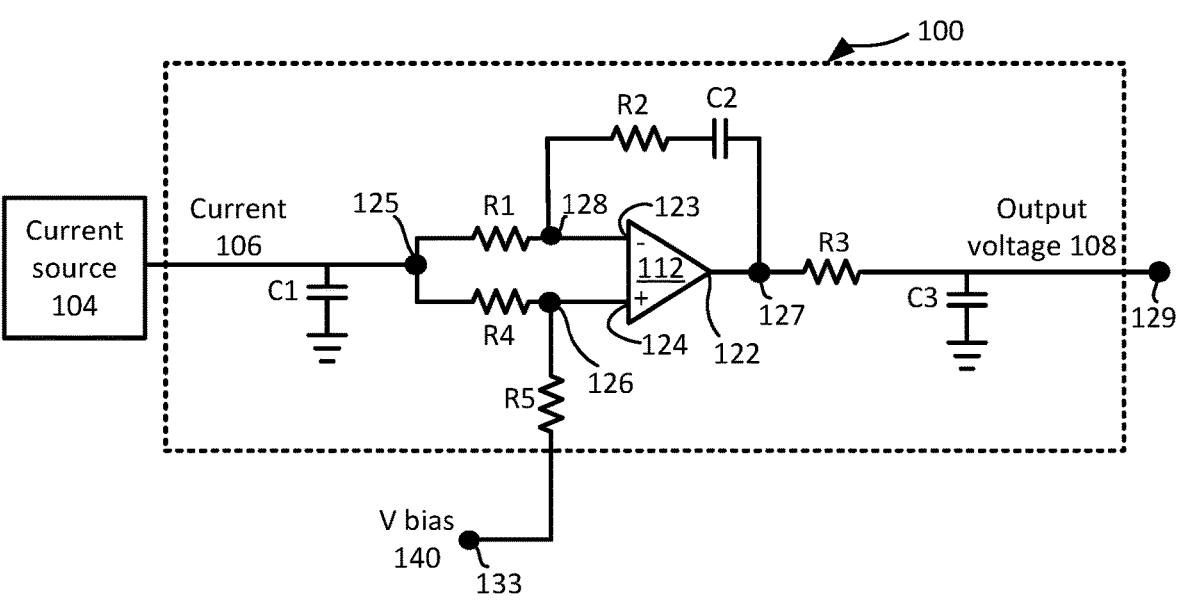
FIG. 1A illustrates a circuit to convert a current signal to an output voltage signal, and reject or reduce noise in the output voltage signal, in accordance with an embodiment of the present disclosure.
FIG. 1B illustrates the circuit of FIG. 1A, with a noise source that may introduce noise in the current signal that is generated by the current source, and the circuit can reject or reduce that noise, in accordance with an embodiment of the present disclosure.

Although the following detailed description will proceed with reference being made to illustrative examples, many alternatives, modifications, and variations thereof will be apparent in light of this disclosure.

DETAILED DESCRIPTION

Described herein is a circuit that cancels or otherwise reduces noise associated with a current source. The circuit can be used in a number of applications but it particularly useful for current to voltage conversion systems, such as a phase locked loop (PLL). The circuit is configured to convert a single-ended input signal from the current source to a differential signal which is then applied at the inputs of an operational amplifier (op-amp). The voltage noise and spurious signal components from the current source are rejected or otherwise reduced by the common mode rejection of the op-amp. As such, when the current source circuit transitions from sinking to sourcing current and vice-versa, the output voltage created by the op-amp does not experience an abrupt voltage step or overshoot caused by noise or spurious components. This smooth voltage transition can be presented for controlling downstream circuitry. In one example, for instance, the circuit is used in a PLL application, wherein the current source is the charge pump of the PLL, and the output voltage is applied to the VCO of the PLL. Such a configuration allows for good PLL performance without inhibiting frequency tuning speed and lock time. Other configurations may be used.

General Overview

In the context of a PPL, noise in the VCO control voltage signal degrades the frequency and/or phase tuning characteristics of the PLL, thereby degrading the performance of the PLL. Increasing the resistive-capacitive (RC) time constant of the loop filter may help generate a less noisy VCO control voltage. However, doing so can adversely impact the tuning speed of the VCO frequency. In this regard, there remain a number of nontrivial issues with respect to PLL design and performance.

Accordingly, techniques are described herein for generating a relatively noise free or low noise output voltage for controlling a VCO of a PLL, without slowing the speed at which that VCO control voltage can be adjusted (tuned). The circuit can be used in any application in which a possibly noisy single-ended current signal is converted to a relatively noise free or otherwise low noise voltage signal, which in turn can be used as the VCO control voltage. In some such examples, the circuit is implemented within the loop filter of the PLL, wherein the loop filter is an active loop filter implemented as an op-amp arranged in a low-pass filter (integrator) configuration. A current source of the PLL, which may be a charge pump or a current synthesizer included in the phase/frequency detector (PFD) or at the output of the PFD, generates a single ended current signal. The single ended current signal is split into a pair of differential current signals using, for example, a resistor network. The differential signals are applied to the inverting and non-inverting inputs of the op-amp. The capacitor in the feedback path of the operational amplifier acts as both a filter capacitor and an integrator, and converts the current to the output voltage. However, due to the splitting of the current signal, any noise voltage within the single-ended input current signal is also split and is applied to the inverting and non-inverting inputs of the op-amp. Thus, the noise voltage and spurious signal component within the single-ended input current signal becomes a common mode noise voltage that is applied in phase and simultaneously to both the inverting input and the non-inverting input of the operational amplifier. The common mode rejection of the operational amplifier effectively cancels, rejects or otherwise filters out such common mode voltage signals, and as such, noise signals provided to both the inverting and non-inverting inputs of the op-amp are not reflected in the output voltage.

Note that the common mode noise filtering and rejection performed by the operational amplifier is decoupled from, and does not rely on, the RC time constant of the active loop filter. Thus, the parameters of the active loop filter that impact the RC time constant can be tuned to make the active loop filter faster (or slower), without any adverse impact on the common mode noise filtering aspect of the active loop filter.

In some such examples, when the current generated by the current source transitions from zero to sinking current (e.g., as in FIG. 2A), or from zero to sourcing current, or from sinking to sourcing current, or from sourcing or sinking current (e.g., when the current source changes a direction of current flow, such as a negative current pulse and a positive current pulse occurs immediately one after another), the abrupt voltage step or overshoot that might be realized if a single-ended noisy input current were used to drive the loop filter and VCO is avoided or otherwise reduced. Thus, the output voltage has a relatively smooth transition, which improves a frequency tuning speed and lock time of the PLL. The input terminal including the resistor network effectively splits the current signal into a pair of differential signals, including a first current signal and a second current signal. Due to matching of various resistors of the resistive divider network, the first current signal and the second current signal are also substantially matched (e.g., within a tolerance acceptable to the application). Numerous configurations and variations will be apparent in light of this disclosure.

Architecture

FIG. 1A illustrates a circuit 100 to convert a current signal 106 to an output voltage signal 108, and reject or reduce noise in the output signal 108, in accordance with an embodiment of the present disclosure. The circuit 100 can be used in many different applications, and is advantageously used in an example to supply a voltage to a VCO of a PLL, as described below with respect to FIG. 3. In an example, the circuit 100 can be an active loop filter of the PLL.

In one embodiment, the circuit 100 receives the current signal 106 from a current source 104. The current source 104 can be any current source supplying or sinking the current signal 106. In the example where the circuit 100 is used in conjunction with a VCO within a PLL (as described below with respect to FIG. 3), the current source 104 is a charge pump or a current synchronizer.

The current source 104 generates positive and/or negative pulses of the current signal 106, so as to maintain a target value of the output voltage 108. For example, the circuit 100 aims to maintain the output voltage 108 at a target voltage, to achieve a target frequency in a PLL. Note that the target voltage level may change. For example, there may be step transition of the target voltage level, based on a change in desired frequency of the PLL.

An output of the current source 104 is coupled to input terminal 125 of the circuit 100, also referred to simply as terminal 125. The terminal 125 is grounded through a capacitor C1. The circuit 100 comprises an operational amplifier 112 having an inverting or "−" input 123, and a non-inverting or a "+" input 124. The inverting input 123 is coupled to input terminal 125 through a terminal 128 and a resistor R1. The non-inverting input 124 is coupled to input terminal 125 through a terminal 126 and a resistor R4.

The terminal 126 and the non-inverting input 124 receive from a bias voltage supply terminal 133 a bias voltage Vbias 104 through a resistor R5. An output 122 of the operational amplifier 112 is coupled to terminal 127. The terminals 127 and 128 are coupled through a resistor R2 and a capacitor C2. Thus, the resistor R2 and the capacitor C2 are within a feedback loop or feedback path of the operation amplifier

112. The terminal 128 provides feedback from the terminal 127 to the inverting input 123 of the operational amplifier 112. The output 122 of the operational amplifier is coupled to an output terminal 129 through a resistor R3. The output terminal 129 is coupled to the ground through a capacitor C3.

In one embodiment, the resistors R1 and R4 are substantially matched and have a same resistance value, e.g., within a tolerance of at most 3%, or at most 2%, or at most 1%, or at most 0.5%. In one embodiment, the resistors R2 and R5 are substantially matched and have a same resistance value, e.g., within a tolerance of at most 3%, or at most 2%, or at most 1%, or at most 0.5%. In this embodiment, the current source 104 signal is divided so the signals at the inverting input 123 and non-inverting input 124 are approximately equal.

FIG. 1B illustrates the circuit 100 of FIG. 1A, with a noise source 120 that may introduce voltage noise and/or spurious signals in the current signal 106 that is generated by the current source 104, in accordance with an embodiment of the present disclosure. Note that the noise source 120 is an unintended or intentional source, and in some examples, the circuit 100 may not include such a noise source. In an example, the noise source 120 models any type of random or pseudo random noise voltage (such as white noise voltage) that may possibly be introduced in the current signal 106. It is assumed that the noise source 120 introduces the noise voltage in the current signal 106, prior to the current signal 106 reaching the input terminal 125 (e.g., the noise voltage is introduced within the current source 104, or between the current source 104 and the input terminal 125). In an example and as described below in detail, the circuit 100 prevents or at least reduces effects of the noise voltage introduced by the noise source 120 in the output voltage 108. Thus, the noise voltage introduced by the noise source 120 is fully or at least partially filtered by the circuit, and is not carried to the output voltage 108.

Figure 2A:
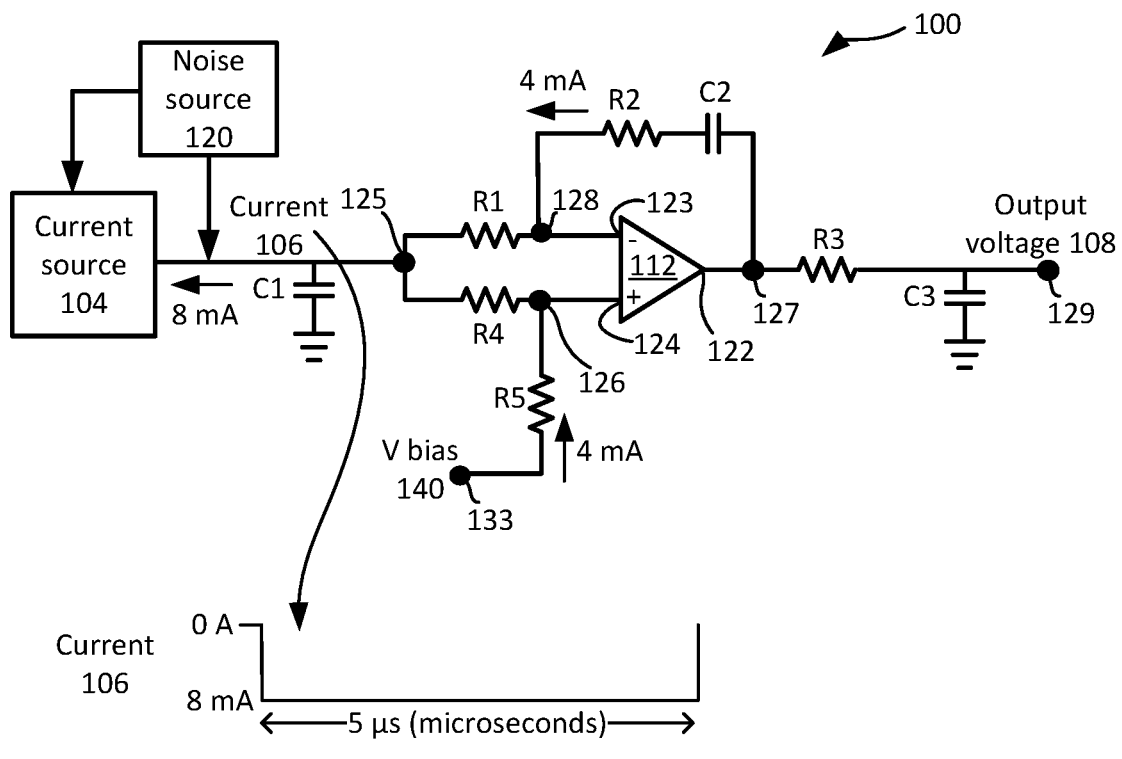
FIG. 2A illustrates an example operating condition of the circuit of FIGS. 1A-1B, and further illustrates two graphs depicting a corresponding operation of the circuit, in accordance with an embodiment of the present disclosure.
Figure 2A:
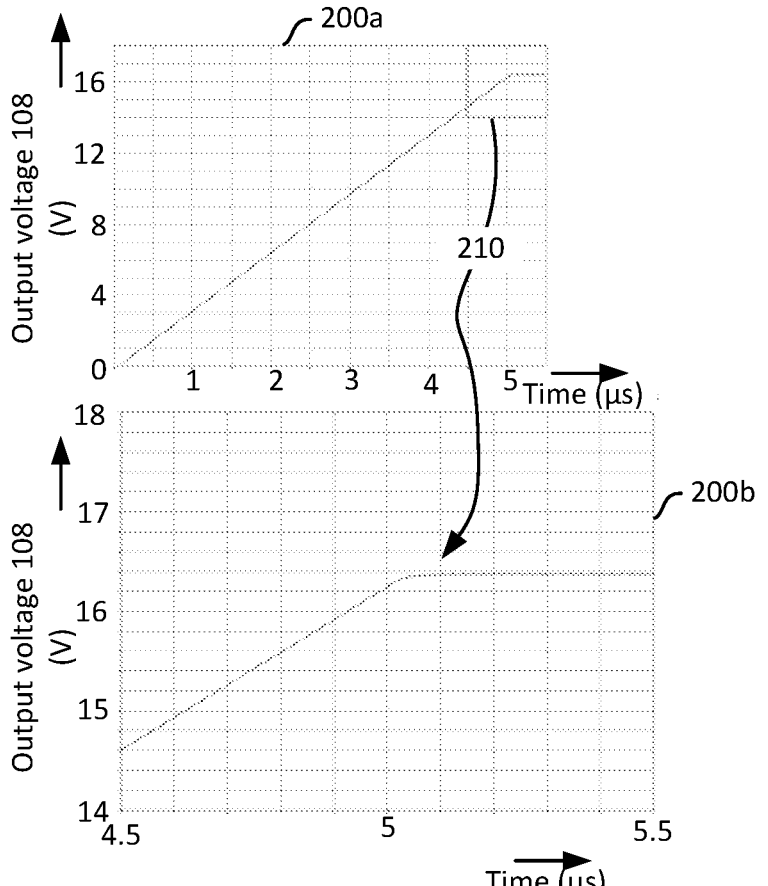

FIG. 2A illustrates an operating condition of the circuit 100 of FIGS. 1A-1B, and further illustrates two graphs 200*a* and 200*b* depicting an operation of the circuit 100, in accordance with an embodiment of the present disclosure. The example current and voltage values described with respect to FIG. 2A are mere examples, and may change from one implementation to the next.

The X axis of each of the graphs 200*a* and 200*b* is time in microseconds (μs), and the Y axis of each of the graphs 200*a* and 200*b* is the output voltage 108. While the graph 200*a* illustrates a variation of the output voltage 108 with time, graph 200*b* illustrates a zoomed out view of a section 210 of the graph 200*a*.

In operation, the current signal 106 is a single ended current signal generated by the current source 104. The input terminal 125 splits the current signal 106 into a pair of current signals, one through the resistor R1 and the other through the resistor R4. In an example, the two current signals through resistor R1 and through resistor R4 are substantially balanced, and matches with each other (e.g., the current through R1 is within 2%, or within 1%, or within 0.5% of the current through R5). The currents are matched because (i) the resistors R1 and R4 are substantially matched, (ii) the resistors R2 and R5 are substantially matched, and (iii) due to the ability of the operational amplifier 112 to maintain substantially the same voltages at terminals 123 and 124 (within a given input offset voltage specification, typically in the pico to micro volt range, although other op-amps may differ in voltage range).

For example, in FIG. 2A, the current signal 106 is an 8 milli ampere (mA) pulse illustrated in FIG. 2A. In this example, the current source 104 acts as a current sink, to receive the 8 mA current from the input terminal 125. Because of the balanced nature of the resistors R1 and R4, and resistors R2 and R5, and also because the operational amplifier 112 aims to maintain substantially the same voltage at inputs 123 and 124, each of the terminal 126 and terminal 128 supplies substantially 4 mA current to the input terminal 125 via the resistors R1 and R4, respectively.

In one embodiment, the capacitor C2 acts as an integrator, e.g., by receiving the current transmitted through the resistor R1 and generating the output voltage 108 at the output terminal 129. The output voltage 108 and the amplification ratio of the circuit 100 is based on a ratio of the resistors R2 and R1. The output voltage 108 starts to increase, as illustrated in graphs 200a and 200b. Once the output voltage 108 reaches a target voltage level of about 16.2 V at about 5 μs (where these values are mere examples), the current pulse of the current signal 106 ends. The controlling of the current pulse (e.g., determining when the current pulse is to end) may be performed by a detector (such as detector 304 described with respect to FIG. 3 below), which monitors a frequency output of the VCO, and ends the current pulse when the frequency reaches a target value.

Thus, the operational amplifier 112 allows the current 106 to produce the output voltage 108 at the output terminal 129. Converting the single ended current signal 106 to a pair of differential signals at the operational amplifier 112 does not impact the output voltage generation capability of the circuit 100. As described above, the input terminal 125 splits the current signal 106 into the substantially matched differential pair of current signals at the inverting and non-inverting inputs of the operational amplifier 112.

However, the operational amplifier 112 is able to reject the common mode noise voltage introduced by the noise source 120, based on the common mode rejection ratio (CMRR) of the operational amplifier 112. Because the common mode noise is applied in phase and simultaneously to both the inverting and non-inverting inputs 123, 124 of the operational amplifier 112, the operational amplifier 112 rejects or at least reduces effects of such common mode noise in the output voltage 108.

For example, the graphs 200a and 200b are generated with the noise source 120 injecting a 50 Hertz (Hz) signal of 400 mV (milli volts) amplitude to the output of the current source 104. However, as illustrated in the magnified view 210 of the graph 200b, such noise signal doesn't significantly adversely affect the output voltage 108. For example, the output voltage 108 does not include any visible ripples caused by the noise source 120.

Note that both the current signal 106 and the noise signal from the noise source 120 are initially a single ended signal at the output of the current source 104. Subsequently, both the current signal 106 and the noise signal are transformed into a pair of differential signals at input terminal 125, such that a differential version of the current signal 106 and the noise signal are applied to the terminals 123, 124 of the operational amplifier 112.

The circuit 100 is able to transform the current signal 106 to the output voltage 108, e.g., by using the capacitor C2 in conjunction with the operational amplifier 112, as described above. For example, the circuit 100 acts as current to voltage converter, as well as an amplifier, to convert the current signal 106 to a corresponding output voltage signal 108 (e.g., converting the 8 mA current pulse to a voltage ramp that achieves a steady state target value at about 16.2 V).

However, due to common mode voltage rejection property of the operational amplifier 112, the common mode noise voltage is rejected, or at least reduced, at the output voltage 108 by the operational amplifier 112. Thus, while the circuit 100 is able to convert the current signal 106, as intended, to the output voltage 108, the circuit is able to substantially filter and reduce effects of the noise voltage within the current signal 106, in an example.

In an example, the noise voltage can be in various forms. For example, when the current generated by the current source 104 transitions from zero to sinking current (e.g., as in FIG. 2A), or from zero to sourcing current, or from sinking to sourcing current, or from sourcing or sinking current (e.g., when the current source changes a direction of current flow, such as a negative current pulse and a positive current pulse occurs immediately one after another), the current signal 106 may have some voltage transients and noise associated with the abrupt transition in the direction of the current flow. However, the circuit 100 rejects or filters out such high frequency voltage transients and noise associated with the abrupt transition in the direction of the current flow, and hence, the output voltage 108 may not have an abrupt voltage step or overshoot due to such a transient voltage. Thus, the output voltage has a relatively smooth transition, which improves a frequency tuning speed and lock time of the PLL. For example, as illustrated in graph 200a, there is no abrupt change or step or overshoot in the output voltage 104.

Figure 2B:
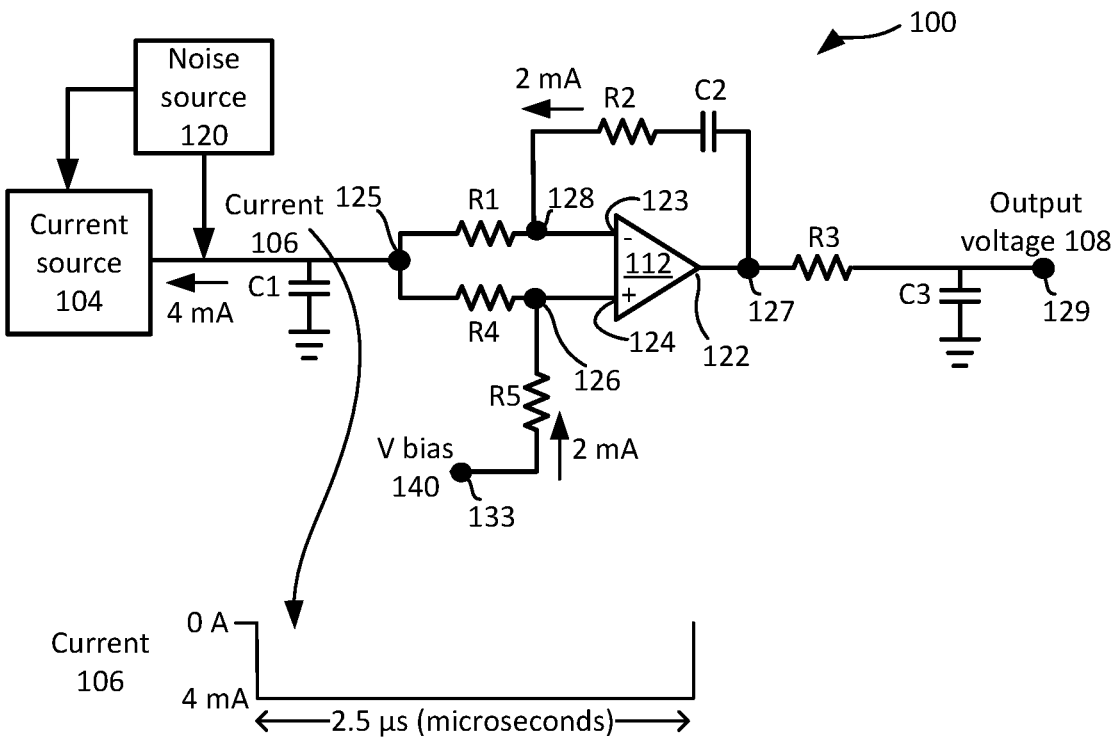
FIG. 2B illustrates another example operating condition of the circuit of FIGS. 1A-1B, and further illustrates two graphs depicting another corresponding operation of the circuit, in accordance with an embodiment of the present disclosure.
Figure 2B:
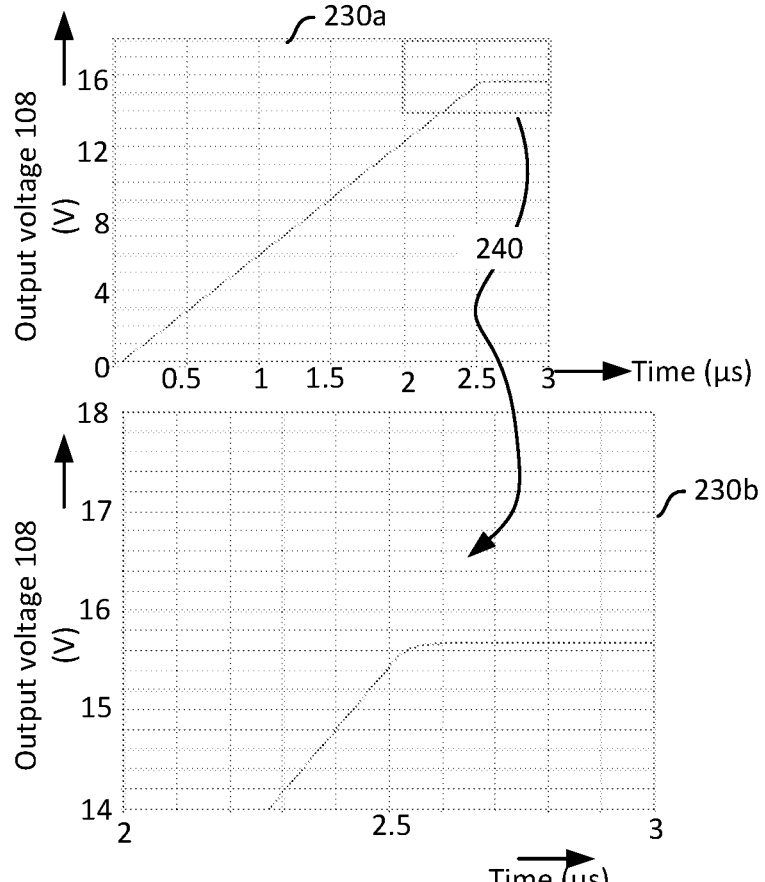

In one embodiment, the common mode noise filtering and rejection performed by the operational amplifier does not rely on an RC time constant of the circuit 100. Accordingly, common mode noise voltage filtering and rejection feature of the circuit 100 is independent of the RC time constant, and hence, independent of a speed of the transient signals achievable by the circuit 100. For example, FIG. 2B illustrates another operating condition of the circuit 100 of FIGS. 1A-1B, and further illustrates two graphs 230a and 230b depicting an operation of the circuit 100, in accordance with an embodiment of the present disclosure.

Note that in FIG. 2A, the output voltage 108 increased from 0 V to about 16.1 V in about 5.1 μs. In contrast, by adjusting one or more parameters of the circuit 100 (such as resistance values of the resistors R1, R2, R3, R4 and/or the capacitance of the capacitor C2), in FIG. 2B, the output voltage 108 increases from 0 V to about 16.1 V is about 2.5 μs, and is achieved by a current signal 106 having a negative pulse of 4 mA for about 2.5 μs, without having significant or any ripples in the output voltage 108 due to the noise voltage introduced by the noise source 120. FIG. 2B will be apparent, based on the above discussion with respect to FIG. 2A. As illustrated in FIG. 2B, the effects of noise in the output voltage 108 is eliminated, or at least reduced by the circuit 100. Thus, the gain and the speed of operation of the circuit 100 is not based on the noise filtering aspect of the circuit 100, and the speed of the circuit 100 may be independent of the phase noise and spurious noise rejection capabilities of the circuit 100.

Figure 3:
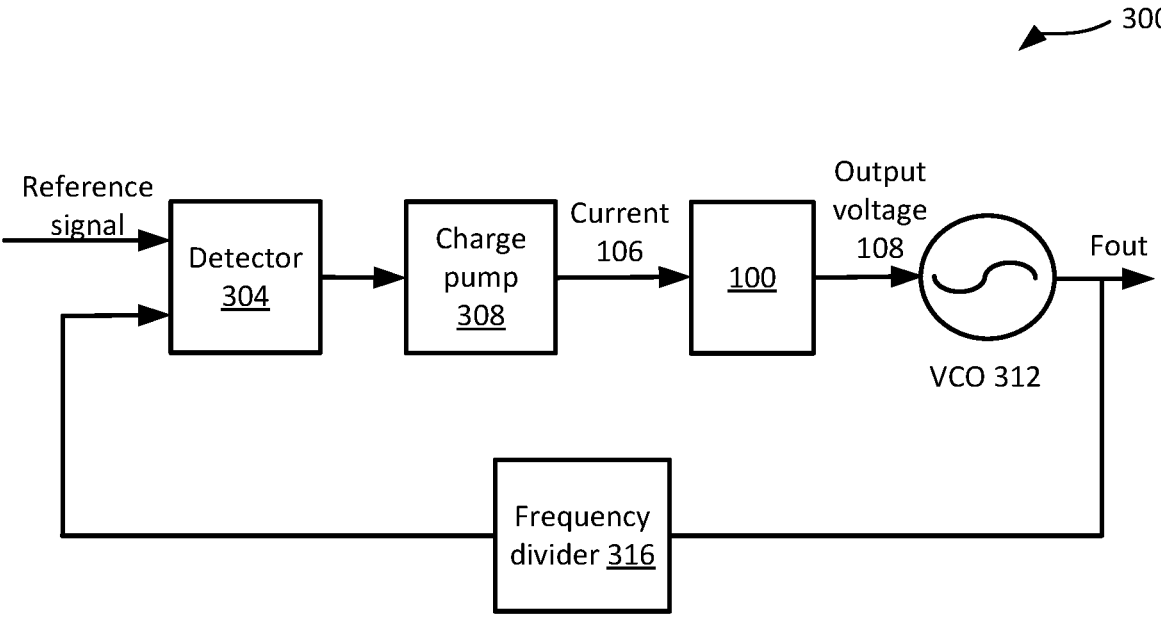
FIG. 3 illustrates a phase locked loop (PLL) employing the circuit of FIGS. 1A-1B, in accordance with an embodiment of the present disclosure.

FIG. 3 illustrates a phase locked loop (PLL) 300 employing the circuit 100 of FIGS. 1A-1B, in accordance with an embodiment of the present disclosure. The PLL 300 comprises a current synthesizer or a charge pump 308, which may be implemented using the current source 104 of FIGS. 1A-2B. The charge pump 308 generates (e.g., sources or sinks) the single ended current signal 106, as also described above with respect to FIG. 1A. The PLL 300 also comprises the circuit 100 receiving the single ended current signal 106, converting the single ended current signal 106 to a pair of differential current signals, and generating the output voltage 108, as described above with respect to FIGS. 1A-2B.

The output voltage 108 is received by a voltage controlled oscillator (VCO) 312. The VCO 312 generates a frequency Fout, based on the voltage level of the output voltage signal 108. The output frequency Fout may be divided by a frequency divider 316 of the PLL 300, and the divided frequency signal is fed back to a detector 304, such as a phase/frequency detector (PFD). The detector 304 compares the feedback frequency and/or phase of the output signal of the PLL 300 with those of a reference signal. The detector 304 may be a phase and/or frequency detector that compares the two frequencies and/or phases, and issues command to alter a level of the output voltage 108, based on the comparison. For example, the detector 304 controls operation of the charge pump 308, e.g., by controlling amplitude and/or width of current pulses of the current signal 106 generated by the charge pump 308, which in turn controls the level of the output voltage 108, which in turn controls the VCO to alter a frequency of the output signal of the PLL. Thus, using feedback through the detector 304, the PLL 300 is able to maintain the output frequency Fout to be at or near a target frequency Fref.

FIG. 4 illustrates a flowchart depicting a method 400 of operating the example circuit 100 of FIGS. 1A-2B, in accordance with an embodiment of the present disclosure. The method 400 includes, at 404, transmitting, by a current source 104, a single ended current signal 106. For example, the detector 304 controls an amplitude and/or a duration of a current pulse of the single ended current signal 106, as described with respect to FIG. 3, and the current source 104 either sources or sinks the current.

The method 400 proceeds from 404 to 408. At 408, at an input terminal 125, the single ended current signal 106 is split into a first current signal and a second current signal, as described above with respect to FIGS. 1A-2B. The first current signal and a second current signal form a pair of differential current signals.

The method 400 proceeds from 408 to 412. At 412, the first current signal is transmitted over the resistor R1 coupled between the input terminal 125 and the inverting input 123 of the operational amplifier 112, and the second current signal is transmitted over the resistor R4 coupled between the input terminal 125 and the non-inverting input 124 of the operational amplifier 112, as described above with respect to FIGS. 1A-2B. Note that although processes 404, 408, and 412 are illustrated as separate operations in FIG. 4, in an example, these processes may be combined as a single process, where the current source 104 sources or sinks a current split among the resistors R1 and R4.

The method 400 proceeds from 412 to 416. At 416, the non-inverting input 124 of the operational amplifier 112 is biased through the resistor R5. The method 400 proceeds from 416 to 420. At 420, at the output terminal 129 coupled to the output 122 of the operation amplifier 112, the output voltage 108 is generated, where the output 122 is coupled to the inverting input 123 of the operational amplifier 112 through the resistor R2 and the capacitor C2, as described above with respect to FIGS. 1A-2B.

Note that the processes in method 400 are shown in a particular order for ease of description. However, one or more of the processes may be performed in a different order or may not be performed at all (and thus be optional), in accordance with some embodiments. For example, all the processes 404-420 of the method 400 may be performed at least in part simultaneously. Numerous variations on method 400 and the techniques described herein will be apparent in light of this disclosure.

FURTHER EXAMPLE EXAMPLES

The following examples pertain to further examples, from which numerous permutations and configurations will be apparent.

Example 1. A circuit comprising: an input terminal for receiving a single-ended input signal; an operational amplifier (op-amp) comprising an inverting input, a non-inverting input, and an op-amp output; a capacitor coupled between the inverting input and the op-amp output; a first resistor coupled between the inverting input and the input terminal; a second resistor coupled between the non-inverting input and the input terminal.

Example 2. The circuit of example 1, comprising: a third resistor coupled in series with the capacitor, and between the inverting input and the op-amp output.

Example 3. The circuit of example 2, wherein a first terminal of the second resistor is coupled to the input terminal and a second terminal of the second resistor is coupled to the non-inverting input, the circuit comprising: a bias voltage supply terminal; and a fourth resistor having first and second terminals, the first terminal of the fourth resistor coupled between the non-inverting input and the second terminal of the second resistor, and the second terminal of the fourth resistor coupled to the bias voltage supply terminal.

Example 4. The circuit of example 3, wherein the third resistor and the fourth resistor have resistance values that are substantially equal.

Example 5. The circuit of any one of examples 1-4, wherein the first resistor and the second resistor have resistance values that are substantially equal.

Example 6. The circuit of any one of examples 1-5, wherein the capacitor is a first capacitor, and wherein the circuit comprises: a second capacitor having (i) a first terminal coupled to the input terminal and (ii) a second terminal coupled to a ground terminal.

Example 7. The circuit of any one of examples 1-6, wherein the capacitor is a first capacitor, and wherein the circuit comprises: a third resistor having (i) a first terminal coupled to the output of the op-amp and (ii) a second terminal coupled to an output terminal; and a second capacitor having (i) a first terminal coupled to the output terminal and (ii) a second terminal coupled to a ground terminal.

Example 8. The circuit of any one of examples 1-8, comprising a current source coupled to the input terminal, wherein the current source is configured to generate the single-ended input signal.

Example 9. The circuit of example 8, wherein the current source is a charge pump generating a charge pump signal that is divided to the inverting input and the non-inverting input.

Example 10. The circuit of any one of examples 1-9, wherein the single-ended input signal is split at the input terminal to (i) a first signal transmitted through the first resistor, and (ii) a second signal transmitted through the second resistor.

Example 11. A phase locked loop (PLL) comprising: the circuit of example 1; and a voltage controlled oscillator (VCO) having a voltage control input coupled to the op-amp output.

Example 12. The PLL of example 11, comprising a phase/frequency detector (PFD) having an output coupled to the input terminal.

Example 13. The PLL of example 12, wherein the circuit is at least part of a low-pass filter that is coupled between the PFD and the VCO.

Example 14. A method comprising: transmitting, by a current source, a single ended current signal; splitting, at an input terminal, the single ended current signal to a first current signal and a second current signal; transmitting the first current signal over a first resistor that is coupled between the input terminal and an inverting terminal of an operational amplifier; transmitting the second current signal over a second resistor that is coupled between the input terminal and a non-inverting terminal of the operational amplifier; and generating, at an output terminal coupled to an output of the operation amplifier, an output voltage, the output of the operation amplifier coupled to the inverting terminal of the operational amplifier through a third resistor and a capacitor.

Example 15. The method of example 14, further comprising: biasing the non-inverting terminal of the operational amplifier through a fourth resistor.

Example 16. The method of any one of examples 14-15, wherein the third resistor and the fourth resistor each have a resistance value that are substantially equal, and wherein the first resistor and the second resistor each have a resistance value that are substantially equal.

Example 17. The method of any one of examples 14-16, further comprising: providing the single ended current signal transmitted by the current source as a pair of differential signals at the operational amplifier.

Example 18. A phase locked loop (PLL) comprising: a charge pump configured to generate a single ended current signal; a circuit configured to (i) convert the single ended current signal to a pair of differential current signals, and (ii) output an output voltage, based at least in part on the pair of differential current signals; and a voltage controlled oscillator (VCO) configured to receive the output voltage.

Example 19. The PLL of example 18, wherein the circuit comprises: an operational amplifier configured to receive the pair of differential current signals; and a capacitor and a resistor in a feedback loop of the operational amplifier, the capacitor configured to convert a current signal of the pair of differential current signals to the output voltage.

Example 20. The PLL of any one of examples 18-19, wherein the circuit comprises: an input terminal configured to receive the single ended current signal, and split the single ended current signal to a first current signal and a second current signal of the pair of differential current signals; a first resistor coupled between the input terminal and an inverting terminal of the operational amplifier, the first resistor to receive the first current signal; and a second resistor coupled between the input terminal and a non-inverting terminal of the operational amplifier, the second resistor to receive the second current signal.

Numerous specific details have been set forth herein to provide a thorough understanding of the examples. It will be understood, however, that other examples may be practiced without these specific details, or otherwise with a different set of details. It will be further appreciated that the specific structural and functional details disclosed herein are representative of examples and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims. Furthermore, examples described herein may include other elements and components not specifically described, such as electrical connections, signal transmitters and receivers, processors, or other suitable components for operation of the circuit 100.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and examples have been described herein. The features, aspects, and examples are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A circuit comprising:
an input terminal for receiving a single-ended input signal;
an operational amplifier (op-amp) comprising an inverting input, a non-inverting input, and an op-amp output;
a capacitor coupled between the inverting input and the op-amp output;
a first resistor coupled between the inverting input and the input terminal;
a second resistor coupled between the non-inverting input and the input terminal;
a third resistor coupled in series with the capacitor, and between the inverting input and the op-amp output;
wherein a first terminal of the second resistor is coupled to the input terminal and a second terminal of the second resistor is coupled to the non-inverting input, the circuit comprising:
a bias voltage supply terminal; and
a fourth resistor having first and second terminals, the first terminal of the fourth resistor coupled between the non-inverting input and the second terminal of the second resistor, and the second terminal of the fourth resistor coupled to the bias voltage supply terminal.

2. The circuit of claim 1, wherein the third resistor and the fourth resistor have resistance values that are substantially equal.

3. The circuit of claim 1, wherein the first resistor and second resistor have resistance values that are substantially equal.

4. The circuit of claim 1, wherein the capacitor is a first capacitor, and wherein the circuit comprises:
a second capacitor having (i) a first terminal coupled to the input terminal and (ii) a second terminal coupled to a ground terminal.

5. The circuit of claim 1, wherein the capacitor is a first capacitor, and wherein the circuit comprises:

a third resistor having (i) a first terminal coupled to the output of the op-amp and (ii) a second terminal coupled to an output terminal; and a second capacitor having (i) a first terminal coupled to the output terminal and (ii) a second terminal coupled to a ground terminal.

6. The circuit of claim 1, comprising a current source coupled to the input terminal, wherein the current source is configured to generate the single-ended input signal.

7. The circuit of claim 6, wherein the current source is a charge pump generating a charge pump signal that is divided to the inverting input and the non-inverting input.

8. The circuit of claim 1, wherein the single-ended input signal is split at the input terminal to (i) a first signal transmitted through the first resistor, and (ii) a second signal transmitted through the second resistor.

9. A phase locked loop (PLL) comprising:

the circuit of claim 1; and a voltage controlled oscillator (VCO) having a voltage control input coupled to the op-amp output.

10. The PLL of claim 9, comprising a phase/frequency detector (PFD) having an output coupled to the input terminal.

11. The PLL of claim 10, wherein the circuit is at least part of a low-pass filter that is coupled between the PFD and the VCO.

12. A method comprising:

transmitting, by a current source, a single ended current signal;

splitting, at an input terminal, the single ended current signal to a first current signal and a second current signal;

transmitting the first current signal over a first resistor that is coupled between the input terminal and an inverting terminal of an operational amplifier;

transmitting the second current signal over a second resistor that is coupled between the input terminal and a non-inverting terminal of the operational amplifier;

generating, at an output terminal coupled to an output of the operation amplifier, an output voltage, the output of the operation amplifier coupled to the inverting terminal of the operational amplifier through a third resistor and a capacitor; and biasing the non-inverting terminal of the operational amplifier through a fourth resistor;

wherein the third resistor and the fourth resistor each have a resistance value that are substantially equal, and wherein the first resistor and the second resistor each have a resistance value that are substantially equal.

13. The method of claim 12, further comprising:

providing the single ended current signal transmitted by the current source as a pair of differential signals at the operational amplifier.

\* \* \* \* \*